United States Patent [19]

Hayashi et al.

[11] Patent Number: 5,331,987
[45] Date of Patent: Jul. 26, 1994

[54] APPARATUS AND METHOD FOR RINSING AND DRYING SUBSTRATE

[75] Inventors: Eiichiro Hayashi; Kazunori Fujikawa, both of Shiga, Japan

[73] Assignee: Dainippon Screen Mfg. Co. Ltd., Japan

[21] Appl. No.: 977,067

[22] Filed: Nov. 16, 1992

[30] Foreign Application Priority Data

Nov. 14, 1991 [JP] Japan ................................ 3-328262

[51] Int. Cl.$^5$ ............................................. B08B 3/10
[52] U.S. Cl. .................................. 134/102.1; 134/105; 134/902; 134/200
[58] Field of Search ................. 134/102.1, 95.2, 102.1, 134/105, 902, 200

[56] References Cited

U.S. PATENT DOCUMENTS

| | | | |
|---|---|---|---|
| 4,132,567 | 1/1977 | Blackwood | 134/200 |
| 4,714,086 | 12/1987 | Kishida . | |
| 4,749,440 | 6/1988 | Blackwood | 134/902 |
| 4,977,688 | 12/1990 | Roberson, Jr. et al. | 134/902 |
| 5,069,235 | 12/1991 | Vetter et al. | 134/902 |
| 5,201,958 | 4/1993 | Breunsbach et al. | 134/95.1 |

FOREIGN PATENT DOCUMENTS

| | | |
|---|---|---|
| 0385536 | 9/1990 | European Pat. Off. . |
| 60-223130 | 11/1975 | Japan . |
| 2-148841 | 6/1990 | Japan ................................ 134/902 |
| 3-30330 | 3/1991 | Japan . |

Primary Examiner—Frankie L. Stinson
Attorney, Agent, or Firm—Ostrolenk, Faber, Gerb & Soffen

[57] ABSTRACT

An apparatus for rinsing and drying a substrate includes a process chamber; a rinsing bath provided in the process chamber and having a first opening and a second opening at the bottom and at the upper portion, respectively; a device for supplying a rinsing solution into the rinsing bath through the first opening; a device for discharging the rinsing solution overflowing from the rinsing bath to the outside of the process chamber; a device for discharging the rinsing solution from the first opening of the rinsing bath; a device for elevating and lowering the substrate between positions above the rinsing bath and within the rinsing bath; a device for supplying predetermined ionized and heated gas, preferably, inactive gas such as nitrogen gas, into the process chamber; and a device for reducing pressure in the process chamber so as to dry the rinsed substrate. The apparatus optionally includes a device for heating the wall surface of the process chamber, and a device for removing the exhaust from the process chamber. Drying of the substrate is promoted by gas supplied into the process chamber when the substrate is pulled upward and out of the rinsing solution, and static electricity generated in the chamber is also electrically cancelled out by the gas, which, in turn, prevents adhesion of particles to the substrate.

16 Claims, 10 Drawing Sheets

APPARATUS AND METHOD FOR RINSING AND DRYING SUBSTRATE

BACKGROUND OF THE INVENTION

1. Field of the Invention

The present invention relates to a method and an apparatus for rinsing various substrates, for example, silicon wafers, glass substrates, electronic components (hereinafter simply referred to as substrates) in heated deionized water and drying the surface thereof in a manufacturing process that is used to produce semiconductor devices, liquid crystal display and other electronic components.

2. Description of the Related Art

In a process of manufacturing semiconductor devices, liquid crystal displays, electronic components or the like, contamination of a substrate by foreign particles must be eliminated. Thus, the step of rinsing and drying the substrate and an apparatus thereof is very important in a process of manufacturing semiconductor devices and the like.

A method and an apparatus for rinsing various substrates, such as silicon wafers, with heated water and drying the surface of the substrates after rinsing thereof is disclosed in Japanese Patent Laying-Open No. 3-30330.

Figure 1:
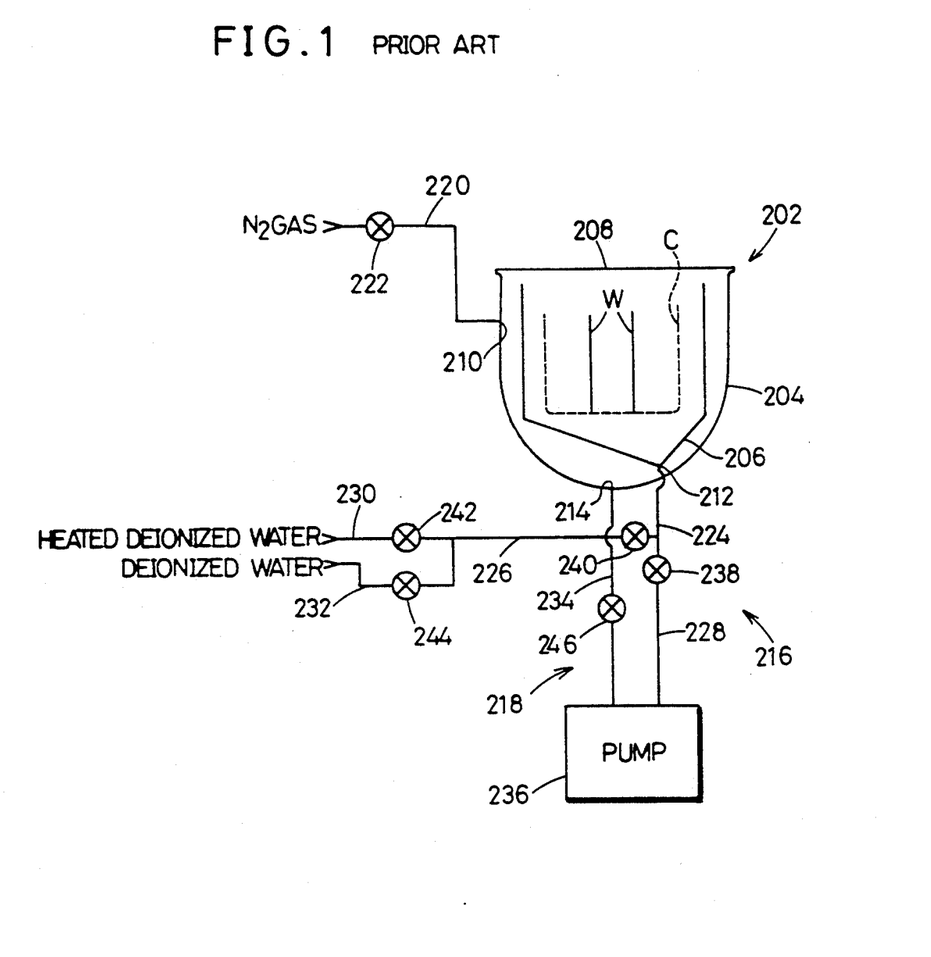
FIG. 1 is a schematic diagram of a structure of a conventional apparatus.

Referring to FIG. 1, the conventional apparatus includes a chamber 202 in which the steps of rinsing and drying are carried out.

The chamber 202 includes an outer chamber 204 shielded by a lid 208, and an inner chamber 206 provided in the outer chamber 204 and having an opening in the upper portion.

The outer chamber 204 has a supply inlet 210 for nitrogen gas formed on the upper side surface. A flow line 220 is connected to the supply inlet 210 for nitrogen gas. An open/close valve 222 is provided in the flow line 220. The end of the flow line 220 is connected to a supply source for nitrogen gas, not shown.

An exhaust outlet 214 for exhausting air in the chamber 202 is formed at the bottom portion of the outer chamber 204. An exhaust flow line 218 is connected to the exhaust outlet 214.

The exhaust flow line 218 includes a flow line 234 having one end connected to the exhaust outlet 214, and an exhaust open/close valve 246 provided in the flow line 234. The other end of the flow line 234 is connected to a vacuum pump 236.

A water inlet/outlet 212 is provided at the bottom portion of the inner chamber 206. A water supply and discharge flow line 216 is connected to the water inlet/outlet 212.

The water supply and discharge flow line 216 includes a flow line 224 having one end connected to the water inlet/outlet 212, flow lines 226 and 228 branching from the flow line 224, and flow lines 230 and 232 further branching from the flow line 226. The flow lines 230 and 232 are connected to supply sources (not shown) for heated deionized water and deionized water, respectively. A water discharge open/close valve 238, a water supply open/close valve 240, heated water open/close valve 242, and water open/close valve 244 are provided in the flow lines 228, 226, 230, and 232, respectively. The other end of the flow line 228 is connected to the aforementioned vacuum pump 236.

A substrate is rinsed and dried as in the following with this apparatus. First, a plurality of substrates W are prepared which are carried in a carrier C. The carrier C is housed in the inner chamber 206.

Heated water is poured into the inner chamber 206 through the flow lines 230, 226, 224, and the water inlet/outlet 212, and the substrates are dipped therein. Then the pressure in the chamber 202 is reduced to the vapor pressure of the heated water or less with the vacuum pump 236, causing the heated water to boil. The substrates W are rinsed by the boiling of the heated water under the reduced pressure.

After rinsing the substrates W, deionized water is poured into the inner chamber 206 through the flow lines 232, 226, 224, and the water inlet/outlet 212, causing the substrates W to be rinsed in the deionized water to be clean. At this time, the deionized water overflowing from the inner chamber 206 is discharged outside the outer chamber 204 through the exhaust outlet 214.

Then, after discharging water in the inner chamber 206 through the water inlet/outlet 212, and flow lines 224 and 228, the air is drawn from the interior of the chamber 202. As a result, the rinsed substrates W are dried. When water in the inner chamber 206 is being discharged, nitrogen gas is simultaneously supplied into the chamber 202 through the flow line 220 and the supply inlet 210 for nitrogen gas. The nitrogen gas prevents dust from adhering to the substrates W.

In the method and the apparatus thereof disclosed in the above-described Japanese Patent Laying-Open No. 3-30330, after washing the substrates W with heated water and rinsing the same with deionized water, water is removed from the surroundings of the substrates by lowering the liquid surface in the inner chamber 206 with the substrates W standing still. However, in the step of discharging water from the inner chamber 206, particles removed from the surface of the substrates W by rinsing and diffused into the liquid are concentrated in the vicinity of the liquid surface. Thus, when the liquid surface is lowered there is a problem that particles will readhere to the surfaces of the substrates W when the liquid surface is lowered on the substrates W that are still standing.

It is also pointed out that the above-described conventional technique has other problems. That is, chamber 202, formed of an anticorrosive material, has an insulating structure. The deionized water, having a large electrical resistance value, is electrically insulated. Therefore, much static electricity is generated in the chamber 202 during the flow of the deionized water. Because of the static electricity, a lot of particles adhere to the surface of the substrates W, for example, a silicon wafer in the chamber 202.

The apparatus disclosed in the above-described Japanese Patent Laying-Open No. 3-30330 further includes a radiating heater, not shown, arranged in the surroundings of the chamber. After rinsing the substrates with water and discharging the water, and before drying the substrates under the reduced pressure, the substrates W are heated supplementarily by the radiating heater in order to promote drying of the substrates W. However, since the interior of the chamber 202 is almost evacuated in the step of drying, heat is not supplied to the substrates by conduction even if the substrates are heated, resulting in poor efficiency of drying. Since the substrates are heated by radiation from the outside of the chamber, only a limited number of materials are suitable for constructing the chamber. That is, the chamber must be constructed of a transparent material such as quartz.

SUMMARY OF THE INVENTION

Briefly, one object of the present invention is to provide an apparatus and a method for rinsing and drying a substrate having the result that fewer particles adhere to the substrate.

Another object of the present invention is to provide an apparatus and a method for rinsing and drying a substrate having the result that adhesion of particles to the substrate caused by static electricity in particular can be reduced.

Still another object of the present invention is to provide an apparatus and a method for rinsing and drying a substrate having the result that adhesion of particles to the substrate in a rinsing solution in particular can be reduced.

A further object of the present invention is to provide an apparatus and a method for rinsing and drying a substrate having the result that adhesion of particles to the substrate can be reduced, and in which the substrate can be dried quickly.

The apparatus for rinsing and drying the substrate according to the present invention includes a process chamber which can be hermetically shielded, and a rinsing bath for containing a rinsing solution provided in the process chamber and having a first opening at the bottom and a second opening at the upper portion through which the substrate can pass. The rinsing solution is supplied in the rinsing bath through the first opening, and rinsing solution overflowing from the second opening of the rinsing bath is discharged outside the process chamber. The apparatus also includes a device for discharging the rinsing solution from the first opening of the rinsing bath to the outside of the process chamber, and a device in the process chamber for elevating and lowering the substrate through the second opening between a first position above the rinsing bath and a second position within the rinsing bath. Predetermined gas which is ionized and heated can be supplied into the process chamber. In order to dry the rinsed substrate, a device for reducing the pressure in the process chamber is provided.

Preferably, the predetermined ionized and heated gas supplied into the process chamber of the apparatus is inactive gas.

A heater for heating the process chamber may be optionally provided. In addition, a blower or the like for exhausting air from the process chamber may be optionally provided.

By supplying the rinsing solution into the rinsing bath through the first opening and by discharging the rinsing solution overflowing from the second opening outside the process chamber, a constant upflow of the rinsing solution is formed in the rinsing bath. By lowering the substrate to the second position within the rinsing bath, the substrate is rinsed by the upflow of the rinsing solution. After completion of rinsing, the substrate is raised to the first position. At this time, the predetermined gas which is ionized and heated is supplied into the process chamber. Static electricity generated in the process chamber during the flow of the deionized water is neutralized electrically by the ionized gas. Therefore, the possibility of adhesion of particles to the substrate is small. Since the gas is heated, drying of the substrate is promoted. By reducing the pressure in the process chamber, the substrate is dried after rinsing.

Since inactive gas is chosen as the gas supplied into the process chamber, the apparatus and the substrate are not damaged.

When a heater for heating the process chamber is provided, condensation in the interior of the chamber is prevented, and drying of the substrate is promoted.

When a blower or the like is provided for exhausting the air from the process chamber, humidity in the process chamber can be lowered, so that condensation of the rinsing solution in the process chamber can be prevented. Therefore, it is possible to promote drying of the substrate.

The method for rinsing and drying the substrate according to the present invention includes the steps of conveying the substrate into the process chamber, operating the device for elevating and lowering the substrate hold the substrate at the first position above the rinsing bath provided in the process chamber; and forming a uniform upflow of the rinsing solution in the rinsing bath by supplying the rinsing solution through the first opening provided at the bottom portion in the rinsing bath and by discharging the rinsing solution overflowing from the rinsing bath through the second opening, provided at the upper portion of the rinsing bath, to the outside of the process chamber. The substrate is rinsed by dipping same in the uniform upflow of the rinsing solution. The method further includes the steps of elevating the rinsed substrate to the first position above the rinsing bath; terminating the supply of the rinsing solution into the rinsing bath and discharging the rinsing solution from the rinsing bath. The predetermined gas which is ionized and heated is supplied into the process chamber. The method further includes the steps of drying the substrate by reducing the pressure in the process chamber after the substrate is pulled out upward from the upflow of the rinsing solution; releasing depressurization in the process chamber after drying of the substrate; and terminating the supply of the predetermined gas is preferably an inactive gas, which is ionized and heated into the process chamber.

As an option the method further includes the step of heating the process chamber to predetermined temperature. The method further includes the step of removing the exhaust from the process chamber while supplying into the process chamber inactive gas which is at least heated.

In order to supply the predetermined gas which is ionized and heated into the process chamber, static electricity generated in the process chamber by the flow of the rinsing solution is cancelled out electrically. Since the gas is heated, the substrate is heated, which, in turn, promotes drying of the rinsed substrate.

By using inactive gas, it is possible to prevent the apparatus and the substrate from being damaged. When the step of heating the process chamber to the predetermined temperature is included, condensation of the rinsing solution in the process chamber is prevented, and drying of the substrate is promoted. Similarly, when the step of removing the exhaust from the process chamber while supplying heated inactive gas into the process chamber is included, since the substrate is heated and condensation of the rinsing solution is prevented, drying of the substrate is further promoted.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First embodiment

Now referring to FIGS. 2-5, the apparatus for rinsing and drying the substrate in accordance with the first embodiment of the present invention. Such apparatus comprises a rinsing and drying process unit 10 which includes a rinsing bath 12 of quartz, SUS (stainless), PVC (polyvinyl chloride) or the like, an overflow receptacle 14 for receiving heated deionized rinsing water for rinsing which overflows from the open top of rinsing bath 12, and a chamber 16 for defining space which can be hermetically sealed at the upper portion of the rinsing bath 12 and the overflow receptacle 14.

The rinsing bath 12 has a supply inlet 18 for heated deionized water and an upper overflow portion 20. The rinsing bath 12 and the overflow receptacle 14 are structured so that heated deionized water flowing from the rinsing bath 12 over the overflow portion 20 enters the overflow receptacle 14. In other words, the rinsing bath 12 and the overflow receptacle 14 constitute a two-layered bath. The rinsing bath 12 has an inner volume in which, for example, a cassette C (FIG. 3) carrying a plurality of substrates, for example, silicon wafers, can be completely dipped in the heated deionized water in the rinsing bath 12.

Figure 3:
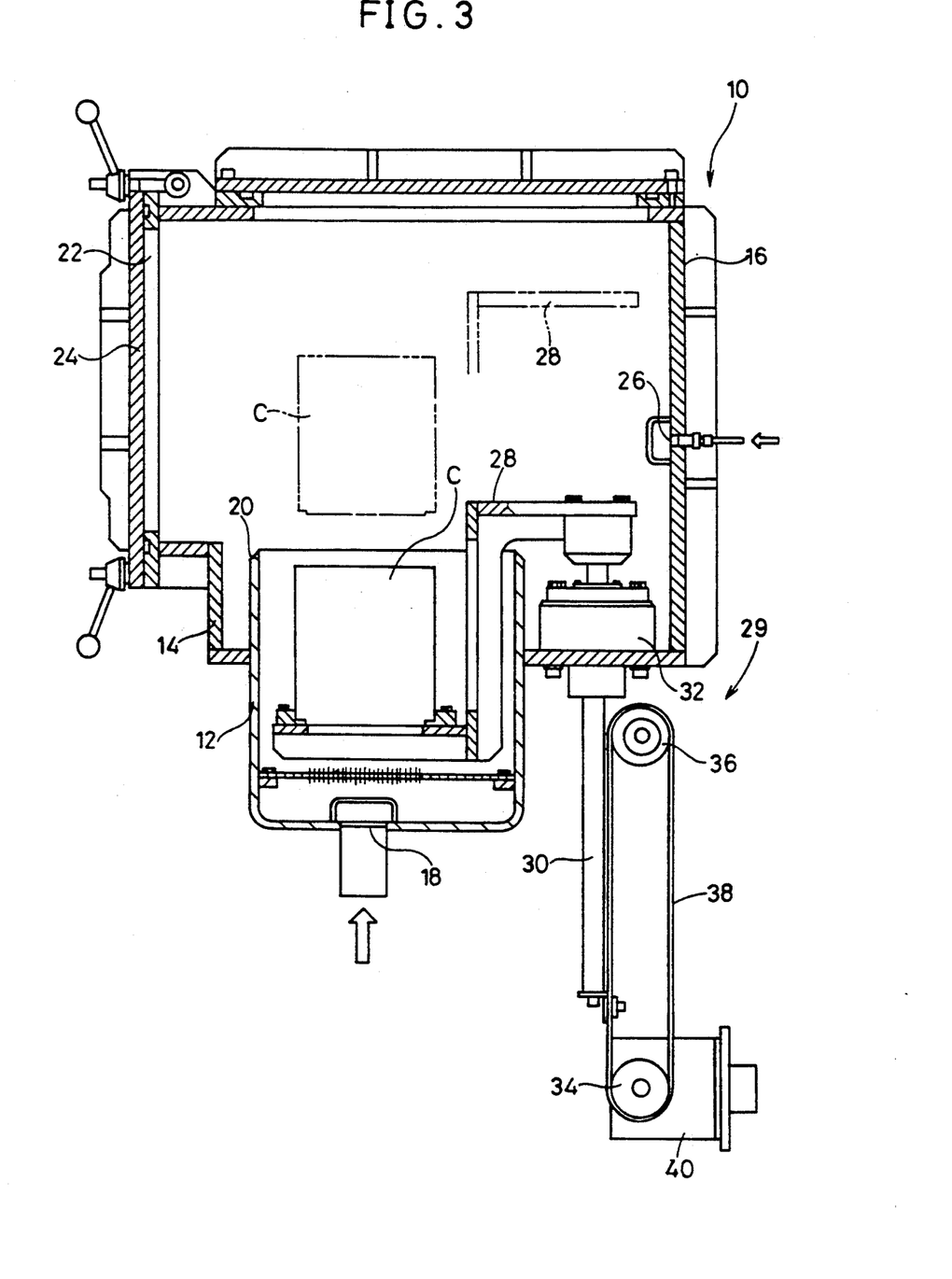
FIG. 3 is a schematic side cross-sectional view of a rinsing and drying process unit of the apparatus shown in FIG. 2.

Referring to FIG. 3, the chamber 16 has an opening 22 on the front side for getting the cassette C in and out. The opening 22 can be closed hermetically by a shielding lid 24. The chamber 16 further has a supply inlet 26 for gas on the sidewall surface.

A holder 28 for holding the cassette C is provided in the chamber 16. An elevating and lowering driving mechanism 29 is provided at the lower portion of the chamber 16 for reciprocating the holder 28 up and down to move the cassette C held by the holder 28 between the position above the rinsing bath shown by a two-dotted line and the position in the interior of the rinsing bath shown by a solid line.

The elevating and lowering driving mechanism 29 includes a driving rod 30 having the upper end portion to which the holder 28 is fixed, a bearing 32 provided at the bottom portion of the chamber 16 for supporting the driving rod 30 slidably, a motor 40 fixed to a frame, not shown, a driving pulley 34 fixed to the end of the rotation shaft of the motor 40, a driven pulley 36 rotatably attached to the frame, not shown, and a belt 38 mounted between the driving pulley 34 and the driven pulley 36 and having a portion to which the lower end of the driving rod 30 is fixed.

Referring again to FIG. 2, a flow line 44 is connected to the supply inlet 18 for heated deionized water provided at the bottom portion of the rinsing bath 12. A flow line 46 is branched from the flow line 44. The flow line 46 is connected to a flow line 42 for supplying heated deionized water communicated to a supply source for heated deionized water, not shown. A ball valve 52, a filter 50, and an air open/close valve 48 are provided in this order in the flow line 42 connecting the supply source for heated deionized water, not shown, and the flow line 46. A flow line 54 for returning heated deionized water for discharging heated deionized water from the flow line 42 is branched from the flow line 42 between the filter 50 and the air open/close valve 48. An air open/close valve 56 is provided in the flow line 54 for returning heated deionized water.

Figure 2:
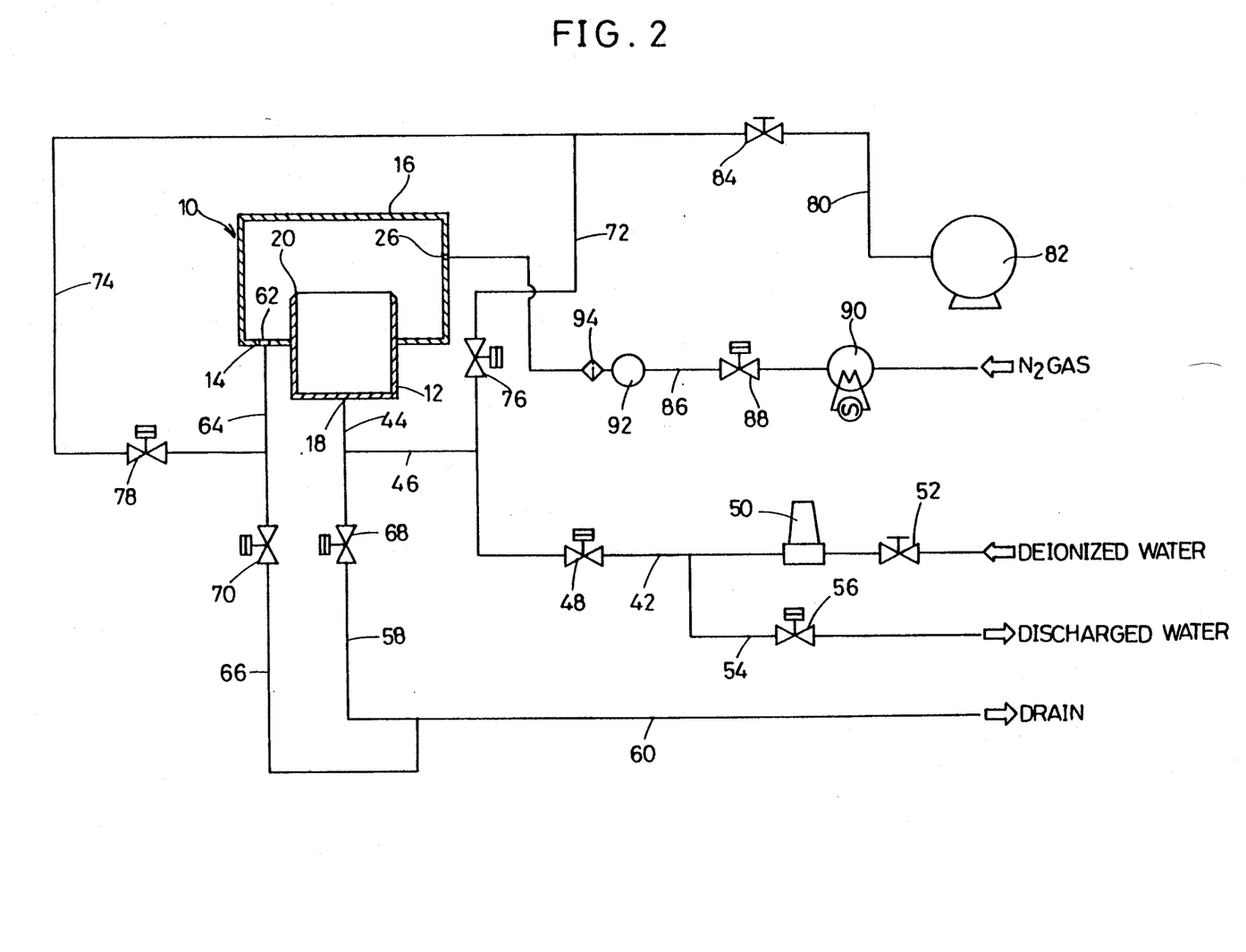
FIG. 2 is a schematic diagram showing the entire structure of an apparatus in accordance with a first embodiment of the present invention.

A vacuum exhaust flow line 72 is further connected to the flow line 46. An air open/close valve 76 is provided in the vacuum exhaust flow line 72. The vacuum exhaust flow line 72 is connected to a water ring vacuum pump 82 through a vacuum exhaust flow line 80. A ball valve 84 is provided in the vacuum exhaust flow line 80. A vacuum exhaust flow line 74 is further connected to the vacuum exhaust flow line 80. The vacuum exhaust flow line 74 is connected to a flow line 64 connected to a water outlet 62 provided at the overflow receptacle 14. An air open/close valve 78 is provided in the vacuum exhaust flow line 74.

The flow line 44 connected to the supply inlet 18 for heated deionized water is also connected to a discharge flow line 58 for heated deionized water through an air open/close valve 68. The flow line 64 connected to the water outlet 62 of the overflow receptacle 14 is connected to a discharge flow line 66 through an air open/close valve 70. The discharge flow lines 58 and 66 join to form a flow line 60 connected to a drain, not shown.

Nitrogen gas is supplied into the chamber 16 through the supply inlet 26 for gas as in the following. Referring to FIG. 2, a supply flow line 86 for nitrogen gas connected to the supply source for nitrogen gas, not shown, is connected to the supply inlet 26 for gas. The supply flow line 86 for nitrogen gas is provided going downstream, with a heater 90, an air open/close valve 88, an ionizer 92, and a filter 94. The heater 90 is for heating nitrogen gas flowing in the flow line 86, and the ionizer 92 is for ionizing nitrogen gas flowing in the flow line 86.

By operating the apparatus shown in FIGS. 2 and 3, one embodiment in accordance with the method of the present invention can be implemented.

The air open/close valves 48 and 70 are opened. Other air open/close valves 56, 68, 76, 78, and 88 are closed. Heated deionized water is sequentially supplied into the rinsing bath 12 through the supply inlet 18 via the supply flow line 42 and the flow lines 46, 44 from the supply source for heated deionized water, not shown. As a result, an upflow of heated deionized water is formed in the rinsing bath 12. When the rinsing bath 12 is filled with heated deionized water, the heated deionized water overflows from the overflow portion 20 to enter the overflow receptacle 14. The heated deionized water entering the overflow receptacle 14 flows into the discharge flow line 64 through the water outlet 62. The heated deionized water is further discharged to the drain through the discharge flow line 66 and the flow line 60. As a result, the constant upflow of heated deionized water is formed in the rinsing bath 12.

Referring to FIG. 3, the shielding lid 24 is detached, and the opening 22 is exposed. The cassette C carrying a plurality of wafers is conveyed through the opening 22 in the chamber 16 to be held by the holder 28. Then, the opening 22 of the chamber 16 is hermetically sealed by the shielding lid 24.

The elevating and lowering driving mechanism 29 is operated to lower the cassette C held by the holder 28 to the position shown by the solid line in FIG. 3. Wafers carried in the cassette C are caused to be dipped in the heated deionized water in the rinsing bath 12. By placing the wafers in the constant upflow of the heated deionized water for a predetermined time, the wafers are rinsed by the heated deionized water. Particles are removed from the surface of the wafers. The particles removed from the wafer surface and diffused into the heated deionized water are discharged from the rinsing bath 12 together with the heated deionized water overflowing from the overflow portion 20 at the upper portion of the rinsing bath 12. These particles are further discharged outside the apparatus together with the heated deionized water to be discharged.

After completion of rinsing of the wafers, the elevating and lowering driving mechanism 29 is operated to elevate the cassette C held by the holder 28 to the position shown by the two-dotted line of FIG. 3. This causes the wafers to be pulled out upward from the heated deionized water in the rinsing bath 12. Since the wafers are pulled out upward from the heated deionized water while the constant upflow is maintained, the phenomenon that the particles diffused into the heated deionized water adhere to the wafer surface is prevented.

At the same time that the wafers begin to be pulled out from the heated deionized water, referring to FIG. 2, the air open/close valve 88 is opened which is provided in the supply flow line 86 for nitrogen gas connected to the supply source for nitrogen gas, not shown. Nitrogen gas is introduced into the chamber 16 through the gas supply inlet 26 via the supply flow line 86 for nitrogen gas from the supply source for nitrogen gas, not shown. The nitrogen gas is heated by the heater 90 and ionized by the ionizer 90. The filter 94 filters the nitrogen gas which is heated and ionized and cleans the same. In this embodiment, supply of the nitrogen gas into the chamber 16 is continued until a series of processing steps are completed.

The wafers heated by the heated deionized water and drained are further heated supplementarily by heated nitrogen gas supplied in the surroundings of the wafers. This promotes drying of the wafers.

The chamber 16 has an insulating structure formed of an anticorrosive material. Therefore, a lot of static electricity is generated in the chamber 16. The voltage of the static electricity which the chamber and the like charge reaches up to as high as 2–10 kV. Conventionally, there was a problem that adhesion of particles to the wafer surface was caused by the static electricity. However, in this embodiment, since nitrogen gas supplied into the chamber 16 is ionized, the static electricity is electrically cancelled out by the ionized nitrogen gas, and disappears. Therefore, adhesion of particles to the wafer surface caused by the static electricity can be effectively prevented.

In order to electrically cancel out the static electricity, it is necessary to make the polarity of the ionized gas supplied into the chamber opposite to that of the static electricity. It has been confirmed in the experiment, however, that the static electricity can be cancelled out to the extent that adhesion of particles causes no problem, even if the supplied gas has been ionized to both positive and negative polarities using an alternating current ionizer.

Referring to FIG. 2, after the wafers are pulled out upward from the heated deionized water, the air open/close valve 48 in the supply flow line 42 for heated deionized water connected to the supply source for deionized water is closed. The air open/close valve 56 provided in the flow line 54 for returning heated deionized water is opened. This causes supply of heated deionized water into the rinsing bath 12 to be halted. Simultaneously, the air open/close valve 68 provided in the discharge flow line 58 for heated deionized water is opened. As a result, the heated deionized water in the rinsing bath 12 is discharged to the drain through the discharge flow line 58 for heated deionized water and the flow line 60.

At the same time that the heated deionized water begins to be discharged from the rinsing bath 12, the air open/close valve 76 provided in the vacuum exhaust flow line 72 and the air open/close valve 78 provided in the vacuum exhaust flow line 74 are respectively opened. By operating the water ring vacuum pump 82, the air is drawn from the chamber 16 through the vacuum exhaust flow lines 72, 74 and 80. By reducing the pressure in the chamber 16, the wafers are dried. Since the wafers are supplementarily heated by the heated nitrogen gas, drying time of the wafer surface is shorter than would be otherwise.

After completion of drying of the wafers, the vacuum pump 82 is halted. The reduced pressure in the chamber 16 is returned to atmospheric pressure. Finally, the air open/close valve 88 provided in the supply flow line 86 for nitrogen gas is closed, and supply of nitrogen gas into the chamber 16 is halted. Referring to FIG. 3, the opening 22 is released by detaching the shielding lid 24. The cassette C carrying the rinsed and dried wafers therein is taken out of the chamber 16 through the opening 22.

Figure 4:
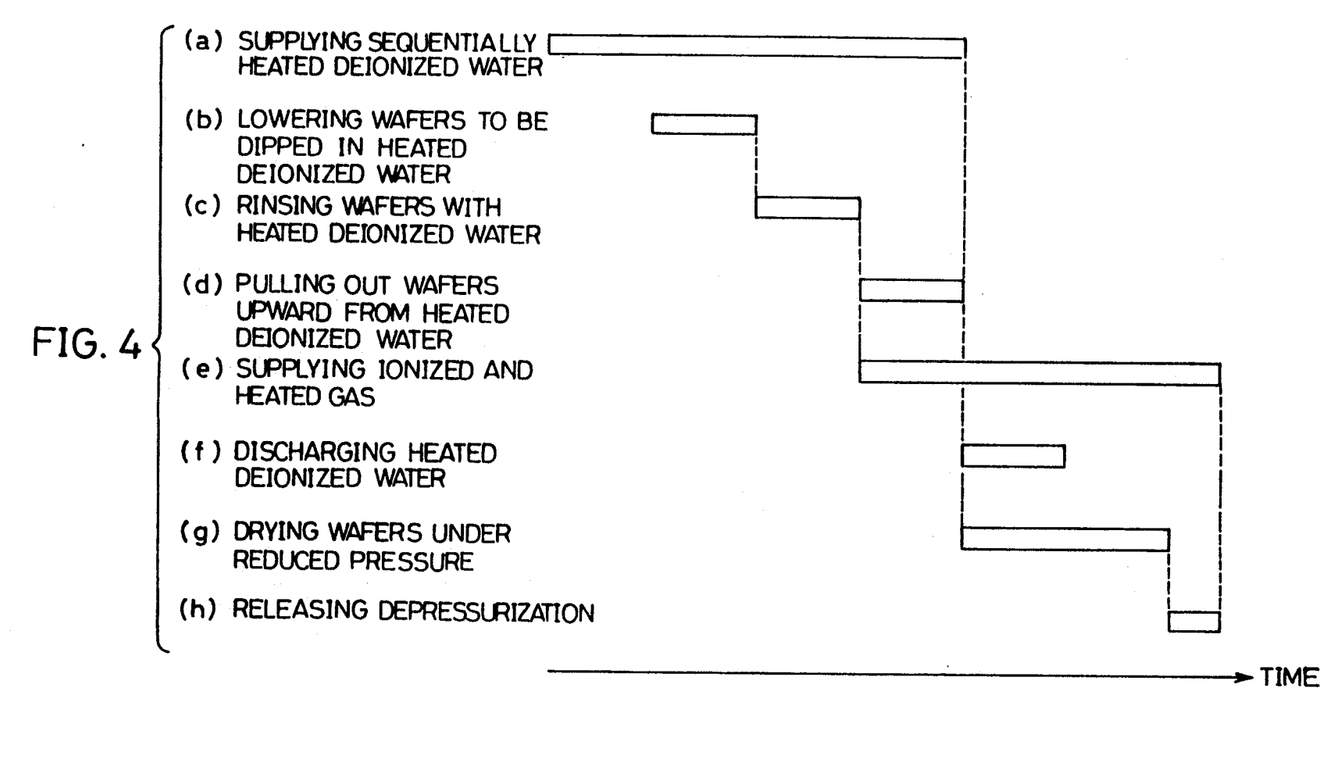
FIG. 4 is a timing chart of the step of rinsing and drying a wafer which is one embodiment of a method in accordance with the present invention.

FIG. 4 shows a timing chart of the above-described series of process. Since description has been given of each step of FIGS. 4 (a)–(h), a detailed description thereof will not be repeated here.

In the timing chart shown in FIG. 4, supply of the ionized and heated gas is initiated simultaneously with initiation of the step of pulling out the wafers upward from the heated deionized water and continued until release of depressurization. However, the present invention is not limited thereto, and supply of gas may be halted simultaneously with completion of the step of pulling out the wafers from the heated deionized water, or supply of gas may be initiated before the wafers are pulled out from the heated deionized water.

An experiment will now be described where a substrate was rinsed and dried by applying the above-described apparatus and the method of one embodiment of the present invention. A series of processing steps was carried out in accordance with the above-described description and the timing chart shown in FIG. 4.

Conditions of the experiment are as in the following: temperature of the heated deionized water was 59° C. The supply rate of heated deionized water was 12.7 l/min. Temperature of nitrogen gas when supplied to the chamber was 45° C. The supply rate of nitrogen gas was 30 l/min. The rinsing process time period with the heated deionized water was five minutes. The volume of the rinsing bath was 15 l, and the volume of the chamber was 104 l. The vacuum pressure in the chamber when it was evacuated to vacuum was 700 mmHg, and the drying time period under the reduced pressure was ten minutes.

As a result of the experiment, the number of particles of 0.16 $\mu$m or larger adhering to a silicon wafer (bare wafer) of six inches diameter could be reduced to 0–8. The number shows a substantial improvement compared to the 100–400 particles that usually adhere when utilizing a conventional method.

Figure 5:
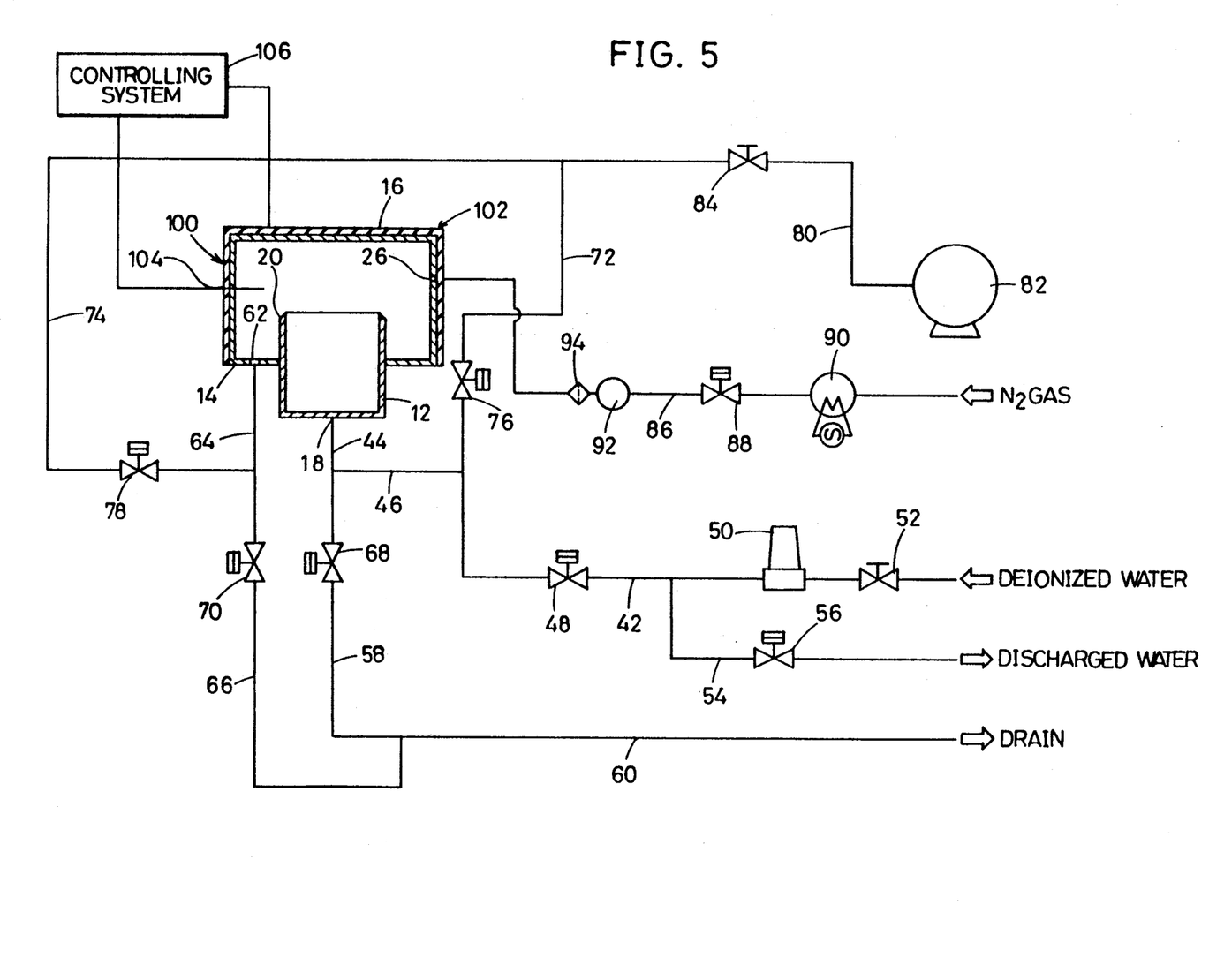
FIG. 5 is a diagram showing the entire structure of an apparatus in accordance with a second embodiment of the present invention.

FIG. 5 shows the structure of the apparatus for rinsing and drying the substrate in accordance with the second embodiment of the present invention. The apparatus shown in FIG. 5 is different from that of FIGS. 2 and 3 in that the former apparatus includes a rinsing and drying process unit 100 including a rubber heater 102 or the like provided on the outer wall of the chamber 16 instead of the rinsing and drying process unit 10 of the FIGS. 2 and 3, and that the former apparatus further includes a controlling system 106 for controlling the rubber heater 102. In FIGS. 5 and 2, the same reference numerals and names are given to the same components. The functions thereof are also the same. Therefore, a detailed description thereof will not be repeated here.

Figure 6:
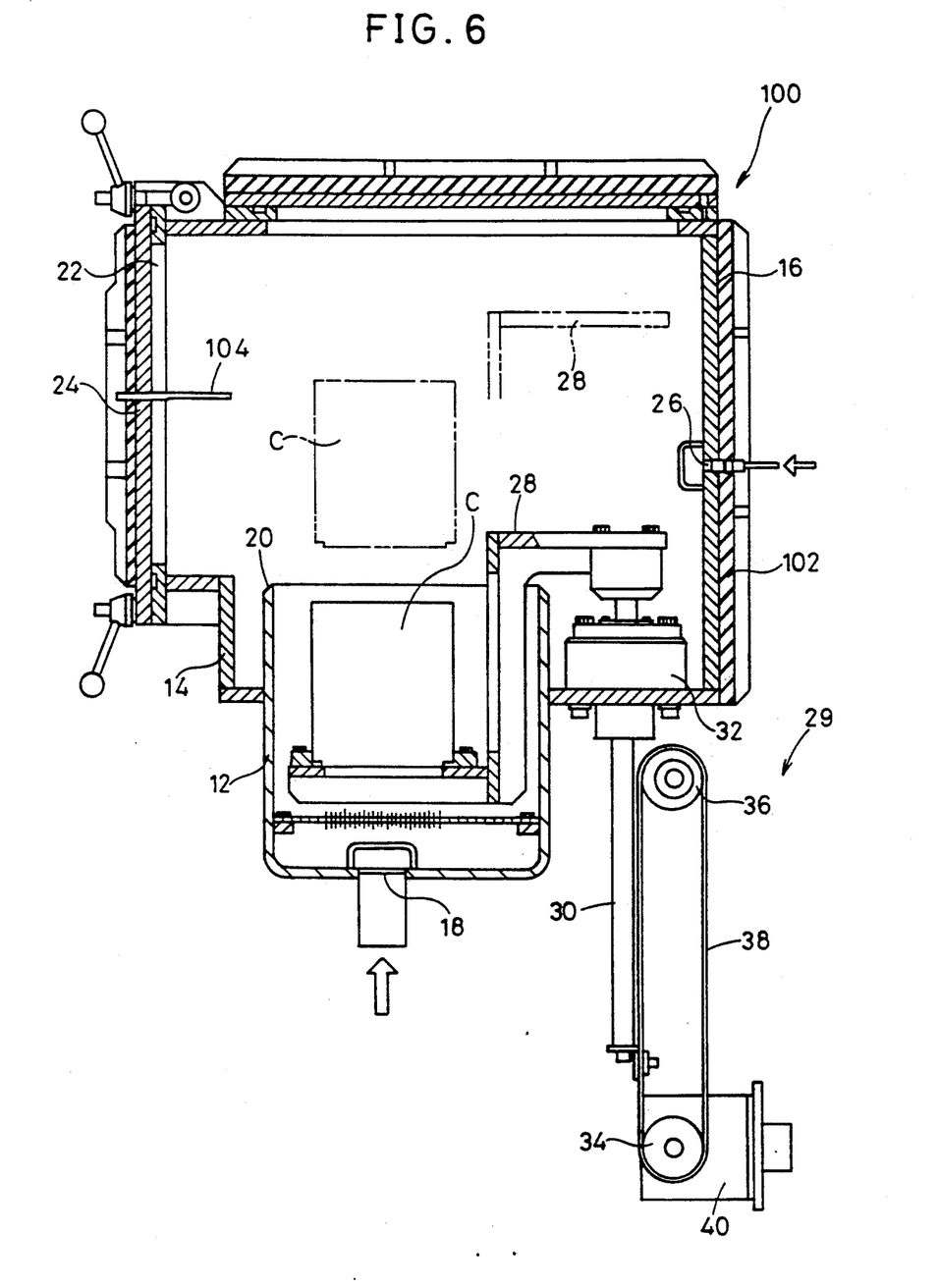
FIG. 6 is a side cross-sectional view of the rinsing and drying process unit of the apparatus shown in FIG. 5.

Referring to FIG. 6, the rinsing and drying process unit 100 of the second embodiment is different from the rinsing and drying process unit 10 of the first embodiment shown in FIG. 3 in that the unit 100 includes the heater 102 provided along the circumference of the chamber 16 as described above, and that the unit 100 further includes a thermometer 104 provided on the inner surface of the shielding lid 24 for measuring temperature of the chamber 161 (the shielding lid 24) to give the measurement result to the controlling system 106 (cf. FIG. 5). In FIGS. 6 and 3, the same reference numerals and names are given to the same components. The functions thereof are also the same. Therefore, a detailed description thereof will not be repeated here.

The apparatus in accordance with the second embodiment aims at making time required for drying the wafer shorter than that required by the apparatus in accordance with the first embodiment. The heater 102, the thermometer 104, and the controlling system 106 are provided for that purpose.

Sometimes vapor is condensed on the chamber wall surface and the like during rinsing of the wafer with heated deionized water. In such a case, thermal energy of heated gas introduced into the chamber 16 is absorbed by drops of water condensed on the chamber inner wall. Therefore, it is impossible to efficiently heat the wafers, sometimes causing time required for drying the wafers to be longer. This embodiment intends to enhance the drying speed of the wafers by heating the chamber wall surface by the heater 102 so as to prevent condensation.

If the temperature of the inner wall surface of the chamber 16 is maintained at or higher than the temperature of the heated deionized water (for example, 60° C.) by the heater 102 using the controlling system 106, condensation onto the inner wall surface of the chamber 16 can be completely prevented. Therefore, it is possible to promote drying of the wafers more than the case of the first embodiment.

As means for heating the chamber inner surface, it is possible to use not only the rubber heater but also a UV (ultraviolet ray) lamp or the like. In this case, since heating is required only for the wall surface mainly and not for the wafers, the heater may be provided either inside or outside the chamber 16. Unlike the conventional example, since the means is not for directly heating the wafers, it is not necessary to form the chamber 16 of a transparent material.

Figure 7:
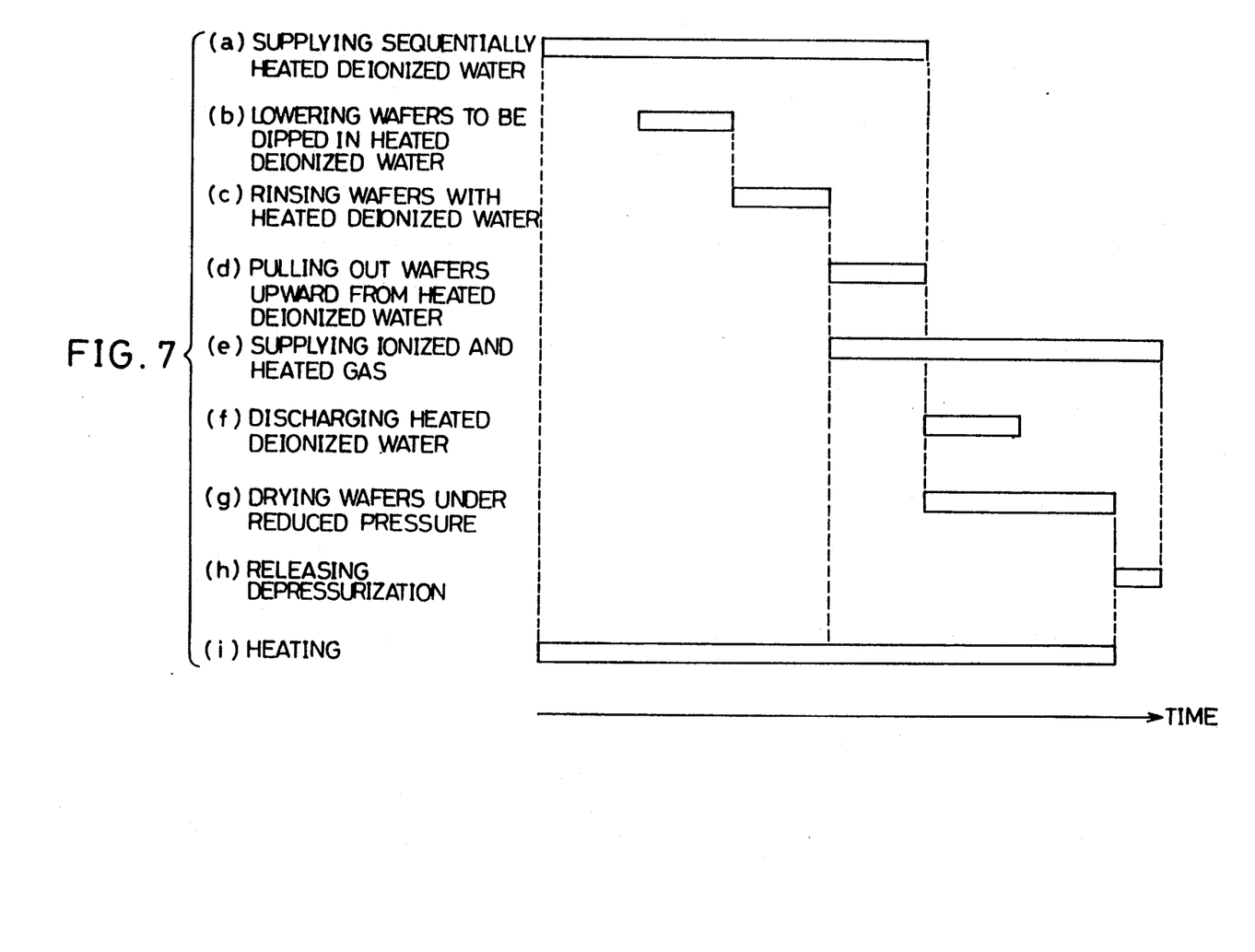
FIG. 7 is a timing chart of the step of rinsing and drying the wafer when the second embodiment of the method of the present invention is carried out with the apparatus of the second embodiment.

FIG. 7 shows an example of a timing chart when the steps of rinsing and drying the wafers are carried out by using the apparatus of the second embodiment. The timing chart of FIG. 7 is the same as that of FIG. 4 except for (i) of FIG. 7. As shown in (i) of FIG. 7, in this embodiment, heating of the chamber 16 is initiated simultaneously with initiation of supply of heated deionized water into the rinsing bath, and completed simultaneously with completion of the process of drying the wafers. Heating of the chamber should be carried out from initiation of supply of heated deionized water into the rinsing bath at least up to initiation of supply of ionized and heated gas into the chamber, as shown in (i) of FIG. 7. Heating of the chamber may be carried out in other steps.

As described above, by providing a heater in the surroundings of the chamber to maintain temperature of the inner surface of the chamber at or higher than the temperature of heated deionized water by the heater, it is possible to prevent condensation onto the chamber inner wall completely. Since heat is not derived from heated gas introduced into the chamber by condensation, it is possible to dry the wafers in a shorter time period. Although, in the above-described embodiment, the amount of heat applied by the heater 102 is controlled by the thermometer 104 and the controlling system 106, the present invention is not limited thereto. For example, without using the thermometer 104, the heater 102 may be controlled so that the amount of heat applied by the heater 102 becomes constant.

Figure 8:
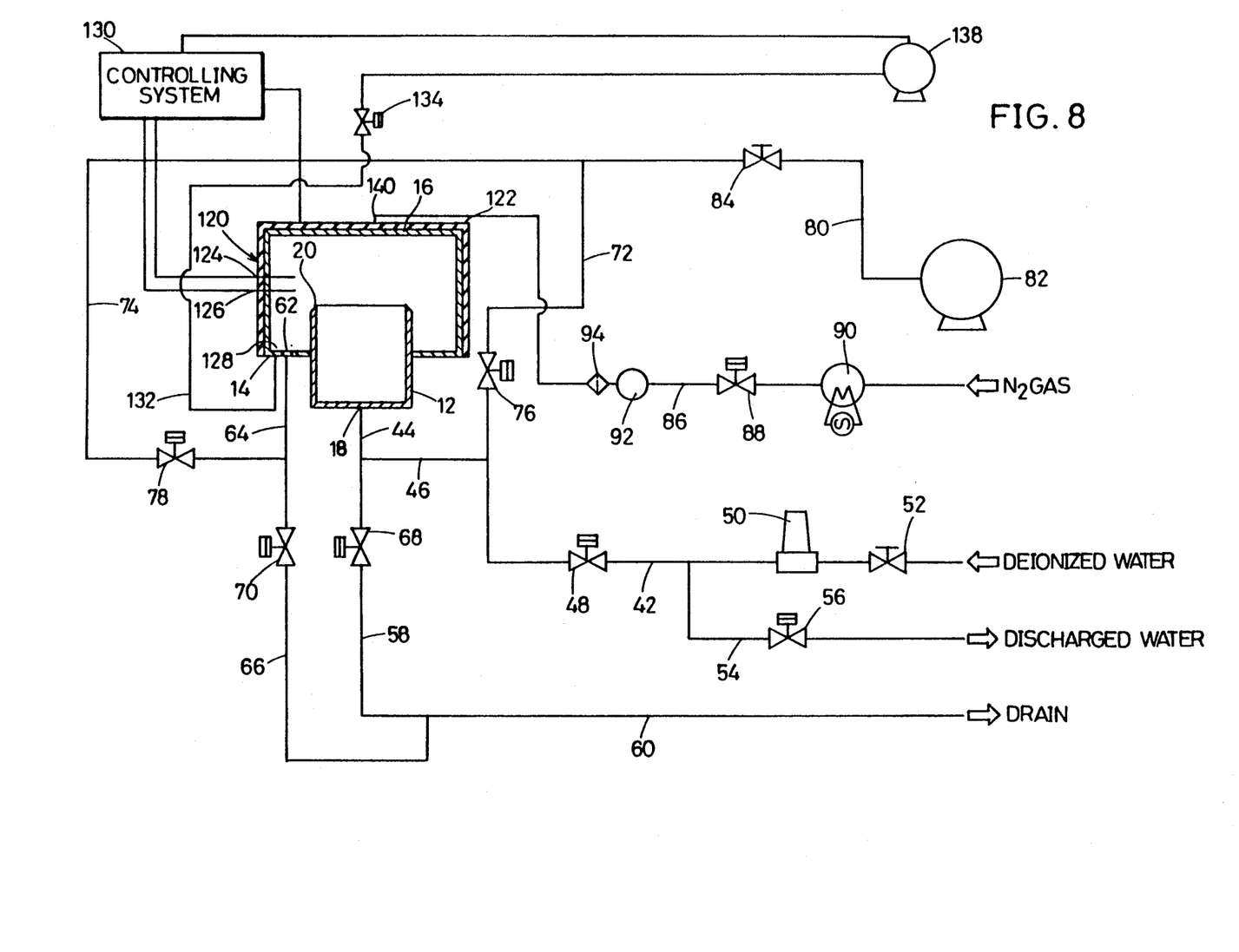
FIG. 8 is a diagram showing the entire structure of an apparatus of a third embodiment of the present invention.

FIG. 8 shows the entire structure of the apparatus for rinsing and drying the substrate in accordance with the third embodiment of the present invention. The apparatus shown in FIG. 8 is different from that of the second embodiment shown in FIG. 5 in that the former apparatus includes a rinsing and drying process unit 120 in place of the rinsing and drying process unit 100, and a controlling system 130 in place of the controlling system 106, and that the former apparatus further includes a blower 138 connected to the water outlet 62 of the chamber 16 by the flow line 132 and controlled by the controlling system 130 for removing the exhaust from the chamber 16 at a predetermined speed.

Figure 9:
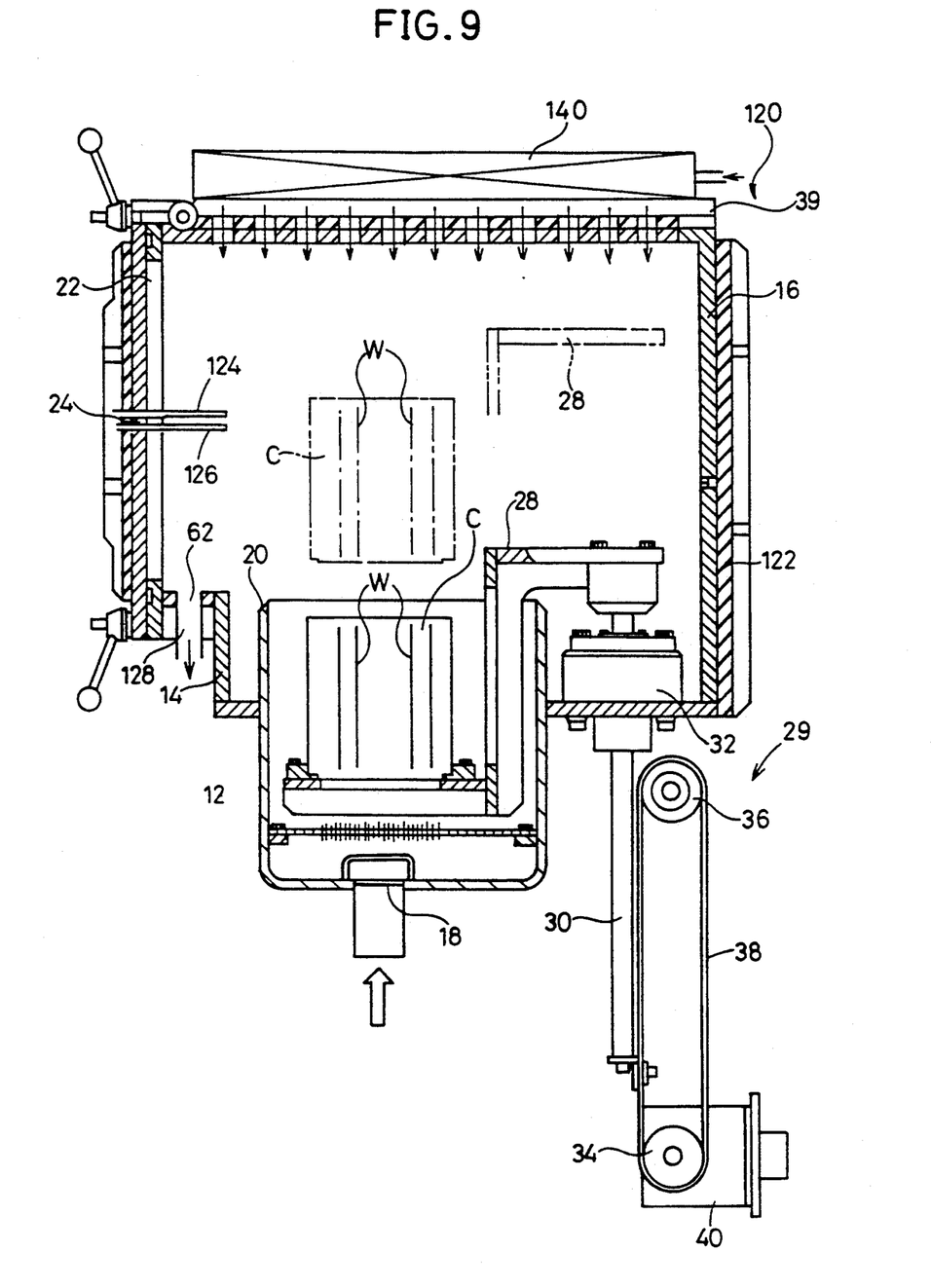
FIG. 9 is a side cross-sectional view of the rinsing and drying process unit of the device shown in FIG. 8.

Referring to FIG. 9, the rinsing and drying process unit 120 of the third embodiment further includes, in addition to the rinsing and drying process unit 10 (FIG. 3) of the first embodiment, a thermometer 124 fixed to the inner surface of the shielding lid 24 for measuring the temperature of the chamber 16, a hygrometer 126 for measuring humidity in the chamber 16, a porous gas supply portion 140 provided at the upper portion of the chamber 16, and a rubber heater 122 or the like provided in the surroundings of the chamber 16 for heating the wall surface of the chamber 16. In FIGS. 9 and 3, the same reference numerals and names are given to the same components. The functions thereof are also the same. Therefore, a detailed description thereof will not be repeated here.

The apparatus of the third embodiment aims at further shortening time required for drying the wafers according to the second embodiment. The blower 138, the air open/close valve 134 and the flow line 132 shown in FIG. 8 are provided for that purpose. In other words, by removing the exhaust from the chamber 16, increase in humidity in the chamber is prevented. This makes it possible to prevent condensation onto the inner wall of the chamber 16. Compared to the case where the wall surface of the chamber 16 is only heated as in the second embodiment, it is possible to effectively prevent condensation, even if temperature of the chamber 16 is lower.

In the third embodiment, the exhaust is removed from the chamber 16 as in the following. The air open/close valve 134 is opened. The blower 138 is controlled so that the exhaust is removed from the chamber 16 through the flow line 132. At this time, referring to FIG. 9, gas is supplied to the chamber 16 through the gas supply portion 140 at the upper portion of the chamber 16. Since the exhaust outlet is provided at the lower portion of the chamber 16, a downflow of the gas moving from the upper portion to the lower portion is formed in the chamber. As a result, particles are guided out of the chamber 16 through the exhaust outlet 62, thereby preventing adhesion of the particles to the wafers. In addition, as shown in FIG. 9, the wafers are aligned by the cassette C so that both surfaces extend in a vertical direction. Therefore, formation of the downflow of gas in the chamber 16 enables gas to pass through the space between the wafers without any disturbance, causing the wafers to be dried effectively.

Figure 10:
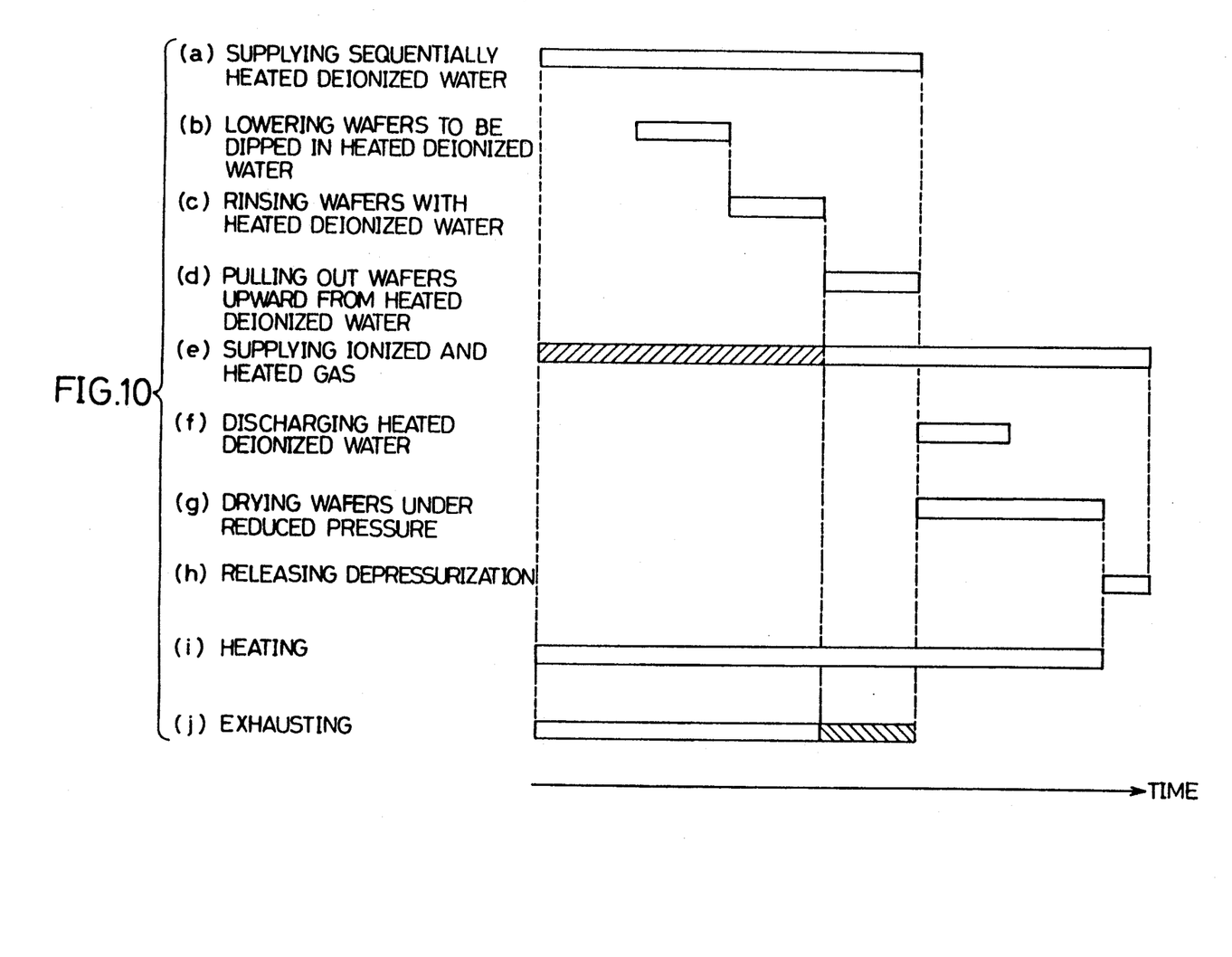
FIG. 10 is a timing chart of the step of rinsing and drying the wafer in accordance with the third embodiment of the method of the present invention with the apparatus of the third embodiment.

FIG. 10 shows a timing chart when the wafers are rinsed and dried using the third embodiment. The timing chart (a)–(i) in FIG. 10 is the same as that of FIG, 7, except for the hatched portions of (e) in FIG. 10 and (j) in FIG. 10. Gas is supplied into the chamber during the time period indicated by the hatched portion of (e) in FIG. 10 as well as during the subsequent time period. However, the step of supplying gas during the time period shown by the hatched portion is different from the subsequent step of supplying ionized gas in that the former gas need not be ionized. Even in this case, it is preferred that nitrogen gas is heated for promotion of drying.

As shown by (j) in FIG. 10, discharging is carried out from initiation of supply of heated deionized water at least up to initiation of the process of pulling out the wafers upward from the heated deionized water. In pulling out the wafers, if the liquid surface of the heated deionized water becomes unstable because of discharging, the discharging will be halted at this time. If the liquid surface of the heated deionized water is stable, it is possible to continue discharging until initiation of depressurization in the chamber as during the time period shown by the hatched portion (j) in FIG. 10. Simultaneously with initiation of depressurization, or prior to the same, it is necessary to halt the discharging. It should be noted that the air open/close valve 134 shown in FIG. 8 should be closed when the process is carried out under reduced pressure.

The controlling system 130 controls the amount of heat of the heater 122 and the amount of discharge by the blower 138 in accordance with outputs of the thermometer 124 and the hygrometer 126. In this case, the amount of discharge of the blower 138 is not necessarily controlled as in this embodiment, and may always be constant.

As described above, the apparatus of the third embodiment lowers humidity in the chamber 16 to prevent condensation onto the chamber wall surface by heating the wall surface of the chamber 16 as well as by discharging the air therein. Since heat is not deprived of gas introduced into the chamber 16 by condensation, supplementary heating of the substrate by gas can be carried out effectively. As a result, it is possible to shorten time required for drying the substrate.

In both the second and the third embodiments, as well as the first embodiment, after the step of pulling out the wafers upward, ionized and heated gas, preferably inactive such as nitrogen gas, is supplied into the chamber. Even if a lot of static electricity is generated in the chamber of an insulating structure and in flowing deionized water, the static electricity is electrically cancelled out by the ionized gas, and disappears. The possibility that the static electricity causes particles to adhere to the surface of the substrate is reduced. Since the substrate is pulled out upward from heated deionized water while the constant upflow is maintained therein, the possibility that the particles diffused from the substrate surface into the heated deionized water readhere to the substrate surface in the pulling up step is small. As a result, adhesion of particles to the substrate surface can be minimized. When the substrate is dried under the reduced pressure, the substrate is not only pulled from the heated deionized water in the vertical direction and drained, but also supplementarily heated by heated gas. Therefore, the substrate surface can be dried in a shorter time period, thereby enhancing efficiency of the series of process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for rinsing and drying a substrate, comprising:

a hermetically sealable process chamber;

a rinsing bath for containing a rinsing solution;

said rinsing bath being in said process chamber, and having a first opening at a lower portion thereof and a second opening at an upper portion thereof;

said second opening being proportioned to permit the substrate to pass therethrough;

means for supplying rinsing solution into said rinsing bath through said first opening;

means for forming an upward flow in said rinsing bath of rinsing solution supplied into said rinsing bath with said upward flow being directed from said first opening to said second opening;

means for discharging rinsing solution that overflows from said rinsing bath through said second opening to the outside of said process chamber;

means for discharging rinsing solution from said rinsing bath to the outside of said process chamber;

means provided in said process chamber for elevating and lowering the substrate through said second opening, between a first position above said rinsing bath and a second position within said rinsing bath;

means for supplying a predetermined gas which is ionized and heated into said process chamber; and means for reducing pressure in said process chamber to dry the rinsed substrate; and wherein said predetermined gas is supplied into said process chamber during a step of elevating the substrate to said first position, the substrate is placed in said upward flow while it is kept at said second position by said means for elevating and lowering the substrate, the substrate is elevated from said second position to said first position by said means for elevating and lowering the substrate and is removed form said upward flow of rinsing solution, directly into said predetermined gas which is ionized and heated, and the substrate is placed in a depressurized ambient at said first position.

2. The apparatus according to claim 1, wherein said means for discharging the rinsing solution to the outside of said process chamber includes means for discharging the rinsing solution from said first opening to the outside of said process chamber.

3. The apparatus according to claim 2, wherein said means for supplying said predetermined gas includes means for supplying ionized and heated inactive gas into said process chamber.

4. The apparatus according to claim 3, wherein said means for supplying ionized and heated inactive gas includes means for supplying ionized and heated nitrogen gas into said process chamber.

5. The apparatus according to claim 3, wherein said process chamber includes an opening for introducing said inactive gas into an interior thereof, said means for supplying said inactive gas includes a gas flow line having two ends, one of said two ends being connected to said opening of said process chamber, a gas source connected to the other end of said flow line for feeding out said inactive gas to said flow line with a predetermined pressure, means for heating said inactive gas flowing in said flow line, and means for ionizing said inactive gas flowing in said flow line.

6. The apparatus according to claim 5, further comprising means for discharging air in from said process chamber to the outside of said process chamber.

7. The apparatus according to claim 3, further comprising heating means that generates heat for heating an inner surface of said process chamber to a temperature equal to or higher than that of said rinsing solution, and wherein said heating means maintains said inner surface of said process chamber at a temperature equal to or higher than that of said rinsing solution at least during a time period which starts at a time when supplying said rinsing solution to said rinsing bath commences and ends at a time when supplying said predetermined gas, which is ionized and heated, into said process chamber commences.

8. The apparatus according to claim 7, further comprising means for controlling said heating means so that temperature of said process chamber is within a predetermined range.

9. The apparatus according to claim 8, wherein said means for controlling said heating means includes means provided in said process chamber for detecting temperature of said process chamber; and means responsive to an output of said means for detecting temperature, for controlling quantities of said heat generated by said heating means.

10. The apparatus according to claim 7, wherein said heating means includes a rubber heater provided in close contact with an outer wall of said process chamber.

11. The apparatus according to claim 1, wherein said rinsing solution includes heated deionized water.

12. An apparatus for rinsing and drying a substrate, comprising:

a hermetically sealable process chamber;

a rinsing bath for containing a rinsing solution;

said rinsing bath being in said process chamber, and having a first opening at a lower portion thereof and a second opening at an upper portion thereof;

said second opening being proportioned to permit the substrate to pass therethrough;

means for supplying rinsing solution into said rinsing bath through said first opening;

means for discharging rinsing solution that overflows from said rinsing bath through said second opening to the outside of said process chamber;

means for discharging rinsing solution from said rinsing bath to the outside of said process chamber;

means provided in said process chamber for elevating and lowering the substrate through said second opening, between a first position above said rinsing bath and a second position within said rinsing bath;

means for supplying a predetermined gas which is ionized and heated into said process chamber; and means for reducing pressure in said process chamber to dry the rinsed substrate;

said means for discharging the rinsing solution to the outside of said process chamber including means for discharging the rinsing solution from said first opening to the outside of said process chamber;

said means for supplying said predetermined gas including means for supplying ionized and heated inactive gas into said process chamber;

said process chamber including an opening for introducing said inactive gas into an interior thereof, said means for supplying said inactive gas including a gas flow line having two ends, one of said two ends being connected to said opening of said process chamber, a gas source connected to the other end of said flow line for feeding out said inactive gas to said flow line with a predetermined pressure, means for heating said inactive gas flowing in said flow line, and means for ionizing said inactive gas flowing in said flow line;

means for discharging air from said process chamber to the outside of said process chamber; and means for controlling said means for discharging air from said chamber so that humidity in said process chamber is maintained within a predetermined range.

13. The apparatus according to claim 12, wherein said means for controlling said means for discharging air from said chamber includes means provided in said process chamber for detecting humidity in said process chamber; and means responsive to an output of said means for detecting humidity, for controlling quantities of an exhaust that is generated by said means for discharging air from said chamber.

14. An apparatus for rinsing and drying a substrate, comprising:
a hermetically sealable process chamber;
a rinsing bath for containing a rinsing solution;
said rinsing bath being in said process chamber, and having a first opening at a lower portion thereof and a second opening at an upper portion thereof;
said second opening being proportioned to permit the substrate to pass therethrough;
means for supplying rinsing solution into said rinsing bath through said first opening;
means for discharging rinsing solution that overflows from said rinsing bath through said second opening to the outside of said process chamber;
means for discharging rinsing solution from said rinsing bath to the outside of said process chamber;
means provided in said process chamber for elevating and lowering the substrate through said second opening, between a first position above said rinsing bath and a second position within said rinsing bath;
means for supplying a predetermined gas which is ionized and heated into said process chamber; and
means for reducing pressure in said process chamber to dry the rinsed substrate;
said means for discharging the rinsing solution to the outside of said process chamber including means for discharging the rinsing solution from said first opening to the outside of said process chamber;
said means for supplying said predetermined gas including means for supplying ionized and heated inactive gas into said process chamber;
said process chamber including an opening for introducing said inactive gas into an interior thereof,
said means for supplying said inactive gas including
a gas flow line having two ends, one of said two ends being connected to said opening of said process chamber,
a gas source connected to the other end of said flow line for feeding out said inactive gas to said flow line with a predetermined pressure,
means for heating said inactive gas flowing in said flow line, and
means for ionizing said inactive gas flowing in said flow line;
means for discharging air from said process chamber to the outside of said process chamber;
said process chamber includes
a bottom face having an exhaust outlet;
a sidewall formed integrally with said bottom face; and
an upper face covering the upper portion of said sidewall, and
said means for discharging air from said process chamber includes
an exhaust flow line having two ends, one of said two ends being connected to said exhaust outlet; and
discharging means operatively connected to the other end of said exhaust flow line.

15. The apparatus according to claim 14, wherein said opening for introducing said gas into said process chamber is formed at said upper face.

16. The apparatus according to claim 15, wherein said opening for introducing gas into said process chamber comprises a plurality of apertures formed at said upper face.

* * * * *